United States Patent
Migita et al.

(10) Patent No.: US 10,312,143 B2
(45) Date of Patent: *Jun. 4, 2019

(54) SEMICONDUCTOR DEVICE AND METHOD OF MANUFACTURING SEMICONDUCTOR DEVICE

(71) Applicant: TOSHIBA MEMORY CORPORATION, Tokyo (JP)

(72) Inventors: Tatsuo Migita, Oita Oita (JP); Koji Ogiso, Oita Oita (JP)

(73) Assignee: Toshiba Memory Corporation, Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 15/061,993

(22) Filed: Mar. 4, 2016

(65) Prior Publication Data

US 2016/0351450 A1 Dec. 1, 2016

(30) Foreign Application Priority Data

May 29, 2015 (JP) .................................. 2015-110745

(51) Int. Cl.
*H01L 23/48* (2006.01)
*H01L 21/768* (2006.01)

(52) U.S. Cl.
CPC ...... *H01L 21/76898* (2013.01); *H01L 23/481* (2013.01); *H01L 21/76888* (2013.01); *H01L 2224/11* (2013.01)

(58) Field of Classification Search
CPC ............ H01L 21/76898; H01L 23/481; H01L 21/76888; H01L 2224/11; H01L 23/53228; H01L 23/53238
See application file for complete search history.

(56) References Cited

U.S. PATENT DOCUMENTS

| 7,276,787 | B2 | 10/2007 | Edelstein et al. |
| 7,564,118 | B2 | 7/2009 | Pogge et al. |
| 8,039,314 | B2 * | 10/2011 | DeGraw ........... H01L 21/76898 257/E21.239 |
| 8,101,517 | B2 | 1/2012 | Frank et al. |

(Continued)

FOREIGN PATENT DOCUMENTS

| CN | 1592965 A | 3/2005 |
| CN | 1684256 A | 10/2005 |

(Continued)

OTHER PUBLICATIONS

Taiwan Office Action dated Jul. 6, 2016, filed in Taiwan counterpart Application No. 104138097, 6 pages (with translation).

(Continued)

*Primary Examiner* — Jose R Diaz
(74) *Attorney, Agent, or Firm* — Kim & Stewart LLP (57) ABSTRACT

A semiconductor device includes a semiconductor substrate, a metal member, and a metal oxide film. The semiconductor substrate is provided with a through-hole that passes through the semiconductor substrate from one surface to another surface opposite to the one surface. The metal member is provided in the through-hole, and includes a cavity therein defined by an internal surface. The metal oxide film coats the internal surface.

10 Claims, 6 Drawing Sheets

(56) References Cited

U.S. PATENT DOCUMENTS

| | | | |
|---|---|---|---|
| 8,581,334 B2* | 11/2013 | Lim | H01L 21/76898 257/330 |
| 8,673,769 B2* | 3/2014 | Boyd | H01L 21/76898 257/672 |
| 8,679,317 B2* | 3/2014 | Isono | C25D 3/38 205/157 |
| 8,901,701 B2* | 12/2014 | Lin | H01L 21/76898 257/522 |
| 8,940,635 B1* | 1/2015 | Chi | H01L 21/76846 257/774 |
| 8,980,738 B2* | 3/2015 | Chapelon | H01L 21/76898 257/779 |
| 9,035,432 B2* | 5/2015 | Reinmuth | H01L 23/481 257/62 |
| 9,054,081 B2 | 6/2015 | Nakamura et al. | |
| 9,153,559 B2* | 10/2015 | Lee | H01L 25/0657 |
| 9,312,207 B2* | 4/2016 | Wakatsuki | H01L 23/481 |
| 9,666,507 B2* | 5/2017 | Chen | H01L 23/481 |
| 9,735,101 B2* | 8/2017 | Cassidy | H01L 23/5226 |
| 9,870,988 B2* | 1/2018 | Cassidy | H01L 24/16 |
| 9,922,957 B2* | 3/2018 | Watanabe | H01L 25/0657 |
| 9,929,107 B1* | 3/2018 | Birner | H01L 23/562 |
| 2012/0276733 A1 | 11/2012 | Saeki et al. | |
| 2013/0249047 A1 | 9/2013 | Hung et al. | |
| 2013/0284999 A1 | 10/2013 | Zheng | |
| 2015/0214134 A1 | 7/2015 | Ogiso et al. | |

FOREIGN PATENT DOCUMENTS

| | | |
|---|---|---|
| CN | 101330042 A | 12/2008 |
| CN | 103367319 A | 10/2013 |
| CN | 203650291 U | 9/2014 |
| JP | 2005-514767 A | 5/2005 |
| JP | 2012-142414 A | 7/2012 |
| JP | 2014011309 A | 1/2014 |
| JP | 2016032087 A | 3/2016 |

OTHER PUBLICATIONS

Japanese Office Action dated May 29, 2018, filed in Japanese counterpart Application No. 2015-110745, 6 pages (with translation).

Taiwan Office Action dated Mar. 6, 2017, filed in Taiwan counterpart Application No. 104138097, 4 pages (with translation).

Chinese Office Action dated Apr. 2, 2018, filed in Chinese counterpart Application No. 201510848901.0, 7 pages (with translation).

* cited by examiner

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2015-110745, filed May 29, 2015, the entire contents of which are incorporated herein by reference.

FIELD

Embodiments described herein relate generally to a semiconductor device, and a method of manufacturing a semiconductor device.

BACKGROUND

There is known a semiconductor device including a metal member, sometimes referred to as a through-silicon (or substrate) via (TSV), which is provided in a through-hole (via hole) formed in a substrate and functions as a through-electrode. In addition, a semiconductor device in which a cavity (void) is formed in the metal member is also known.

When a through substrate via is formed having a cavity or void in the body thereof, there is an issue in that cracks formed in the metal member are likely to diffuse or extend from the metal member into surrounding materials.

DETAILED DESCRIPTION

An exemplary embodiment is made in consideration of the above-described problem. The exemplary embodiment provides a semiconductor device wherein the diffusion of a crack in a metal member having a cavity therein is suppressed, and a method of manufacturing the semiconductor device is also provided.

According to an embodiment, a semiconductor device includes a semiconductor substrate, a metal member, and a metal oxide film. The semiconductor substrate is provided with a through-hole that passes through the semiconductor substrate from a first surface to a second, opposed surface thereof. A metal member, such as a metal stud, is provided in the through-hole, and includes a cavity therein defined by an internal surface of the metal member. A metal oxide film is provided between the metal member and the cavity, coating the internal surface of the metal member.

The same structural elements are included in the following exemplary embodiment or modification example. Accordingly, in the following description, the same reference numerals will be given to the same structural elements, and redundant descriptions will be partially omitted. Portions which are included in the embodiment or the modification example may be replaced with corresponding portions of other embodiments or modification examples. In addition, a configuration, a position, and the like, of the portions, which are included in the embodiment or the modification example, are the same as those other embodiments or modification examples unless otherwise stated.

Example Embodiment

Figure 1:
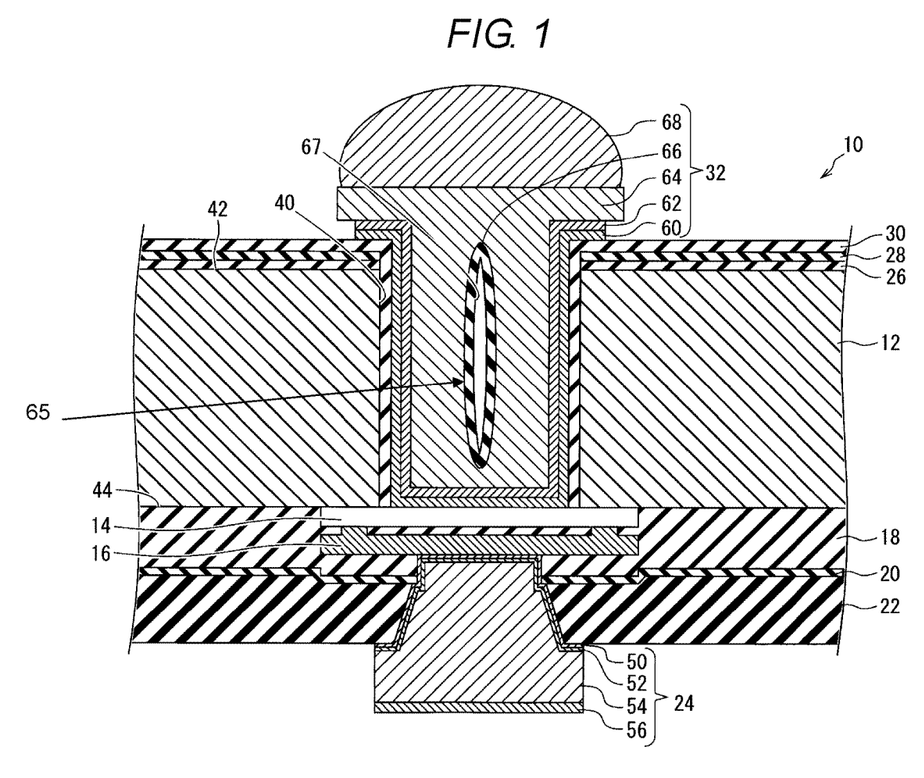
FIG. 1 is a longitudinal cross-sectional view of a semiconductor device according to this embodiment.

FIG. 1 is a longitudinal cross-sectional view of a semiconductor device 10 according to an embodiment. The semiconductor device 10 includes a through-silicon via (TSV).

As illustrated in FIG. 1, the semiconductor device 10 includes a substrate 12, a device section 14, a wiring layer 16, an interlayer insulating layer 18, a first passivation layer 20, a second passivation layer 22, an electrode pad 24, a first insulating layer 26, a second insulating layer 28, a third insulating layer 30, and a through-electrode 32.

The substrate 12 includes a semiconductor as a main component. For example, the substrate 12 may include silicon as a main component thereof. For example, the thickness of the substrate 12 is in a range from 25 µm to 35 µm. A through-hole 40 is formed in the substrate 12. The through-hole 40 is formed to extend through the substrate 12 from one surface 42 (second surface) of the substrate 12 to the other, opposed, surface 44 (first surface) of the substrate 12. That is, the through-hole 40 passes through the substrate 12. For example, the through-hole 40 of FIG. 1 has a circular shape in a plan view. Accordingly, the through-hole 40 has a cylindrical shape. In a plan view (not shown), an example of the diameter of the through-hole 40 is 10 µm.

The device section 14 includes a semiconductor element such as one or more transistors. The device section 14 is provided on and in the first surface of the substrate 12. The device section 14 includes a gate electrode layer (not illustrated).

The wiring layer 16 is provided on the opposite side of the device section 14 from the substrate 12. The wiring layer 16 is electrically connected to a semiconductor element of the device section 14. The wiring layer 16 contains a conductive material. For example, the wiring layer 16 contains one or more of tungsten, nickel silicide, cobalt silicide, copper, aluminum, boron-doped polysilicon, and the like as a main component thereof. Although in FIG. 1 the wiring layer 16 is illustrated as a single layer, the wiring layer 16 may have a multi-layer wiring structure including a plurality of wiring layers.

The interlayer insulating layer 18 covers at least a portion of the first surface 44 of the substrate 12, the device section 14, and the wiring layer 16 for insulation thereof, except for a region, in which the device section 14 and the wiring layer 16 are electrically connected to each other, and the like. The interlayer insulating layer 18 includes an insulating material as a main component. For example, the interlayer insulating layer 18 of FIG. 1 is formed of a silicon oxide film.

The first passivation layer 20 covers at least a portion of the interlayer insulating layer 18. The first passivation layer 20 protects the wiring layer 16 from moisture in outside air that would otherwise penetrate through the second passivation layer 22, and the like. The first passivation layer 20 may be formed of silicon nitride film.

The second passivation layer 22 covers at least a portion of the first passivation layer 20. The second passivation layer 22 protects the device section 14 and the like. The second passivation layer 22 is formed of an insulating resin. For example, the second passivation layer 22 may contain a polyimide resin as a main component.

The electrode pad 24 is electrically connected to the wiring layer 16. A portion of the electrode pad 24 extends through the second passivation layer 22. The electrode pad 24 may be electrically connected to a through-electrode 32 of another semiconductor device 10. The electrode pad 24 includes a barrier metal layer 50, a seed layer 52, an electrode main body 54, and an electrode connection portion 56.

The barrier metal layer 50 covers a portion of the wiring layer 16. The barrier metal layer 50 is electrically connected to the wiring layer 16. The barrier metal layer 50 suppresses diffusion of a metal material from the electrode main body 54 into the interlayer insulating layer 18. The barrier metal layer 50 contains a metal material such as titanium (Ti) as a main component.

The seed layer 52 covers an inner surface of the barrier metal layer 50. The seed layer 52 contains a material, which forms a plating seed for electroplating the metal material of a metal containing embodiment of the electrode main body 54. For example, the seed layer 52 may contain copper (Cu) as a main component.

The electrode main body 54 is formed to overlie the seed layer 52 and substantially fill the through-hole 40. The electrode main body 54 generally contains a conductive material as a main component thereof. For example, the electrode main body 54 may contain nickel (Ni) as a main component. Further, the electrode main body 54 may be formed of a material that includes at least one element from among copper (Cu), gold (Au), silver (Ag), cobalt (Co), palladium (Pd), tungsten (W), tantalum (Ta), Pt (platinum), Rh (rhodium), Ir (iridium), Ru (ruthenium), Os (osmium), Re (rhenium), Mo (molybdenum), Nb (niobium), B (boron), and Hf (hafnium).

The electrode connection portion 56 covers a surface of the electrode main body 54 which is opposite to a surface thereof that covers the barrier metal layer 50. The electrode connection portion 56 contains a conductive material as a main component. For example, the electrode connection portion 56 may contain gold (Au) as a main component.

The first insulating layer 26 covers at least a portion of the second surface 42 of the substrate 12. The first insulating layer 26 contains an insulating material as a main component. For example, the first insulating layer 26 includes silicon oxide film as a main component. The first insulating layer 26 forms an electrical insulator on the second surface of the substrate 12.

The second insulating layer 28 covers at least a portion of the exposed surface of the first insulating layer 26. The second insulating layer 28 contains an insulating material as a main component. For example, the second insulating layer 28 includes a silicon nitride film.

The third insulating layer 30 covers an exposed surface of the second insulating layer 28, and the side surface of the through-hole 40 extending through the substrate 12. The third insulating layer 30 contains an insulating material as a main component. For example, the third insulating layer 30 may be a silicon oxide film.

The through-electrode 32 includes a barrier metal layer 60 that is an example of a metal layer, a seed layer 62 that is an example of a metal layer, a via-electrode 64 that is an example of a metal member, a metal oxide film 66, and an electrode connection portion 68.

The barrier metal layer 60 covers the portion of the third insulating layer 30 that is formed in an opening of the through-hole 40 in the second surface 42, and the surface of the third insulating layer 30 that is formed on the inner wall of the through-hole 40. In addition, the barrier metal layer 60 covers an opening of the through-hole 40 at the first surface 44. The barrier metal layer 60 is electrically connected to a gate electrode layer that is included in the device section 14. The barrier metal layer 60 suppresses diffusion of a metal material from the seed layer 62 into the third insulating layer 30. The barrier metal layer 60 contains a metal material such as titanium (Ti) as a main component.

The seed layer 62 covers an inner surface of the barrier metal layer 60. In other words, the seed layer 62 is formed in the opening of the through-hole 40 that is formed in the one surface 42 and on the barrier metal layer 60 on the inner surfaces of the through-hole 40. The seed layer 62 contains a material, which becomes a plating seed for a plated metal material that configures the via-electrode 64, as a main component. For example, the seed layer 62 may contain copper (Cu) as a main component.

The via-electrode 64 is formed on the seed layer 62. The via-electrode 64 is provided in, and fills, the through-hole 40. That is, the via-electrode 64 is embedded in the through-hole 40. A portion of the via-electrode 64 protrudes outwardly from the opening of the through-hole 40 at the second surface 42. The via-electrode 64 contains a conductive material as a main component. For example, the via-electrode may contain nickel (Ni) as a main component. The via-electrode 64 may be formed of a material that includes at least one element chosen from copper (Cu), silver (Ag), cobalt (Co), tungsten (W), tantalum (Ta), Rh (rhodium), Ir (iridium), Ru (ruthenium), Os (osmium), Re (rhenium), Mo (molybdenum), Nb (niobium), B (boron), and Hf (hafnium). A cavity 67 is formed in the via-electrode 64, defined by an internal surface 65 of the via-electrode 64. The cavity 67 mitigates stress that occurs in the via-electrode 64.

The metal oxide film 66 is formed between the via-electrode 64 and the cavity 67 on the internal surface 65. In other words, the metal oxide film 66 covers at least a portion of the internal surface 65 which would otherwise directly define the cavity 67. The metal oxide film 66 contains a metal oxide, which may be an oxide of the metal material that configures the via-electrode 64, as a main component, in an embodiment where the conductive material of the via-electrode 64 is a metal. For example, the metal oxide film 66 may be a nickel oxide, which contains nickel that configures the via-electrode 64, as a main component. In the depicted embodiment, the cavity 67 is encapsulated in (surrounded by), the through via-electrode 64 conductive material, and the metal oxide film 66 surrounds the cavity 67.

The electrode connection portion 68 is formed on a portion of the via-electrode 64 that protrudes from the opening of the through-hole 40 that is formed in the one surface 42. The electrode connection portion 68 contains a conductive material as a main component. It is preferable that the electrode connection portion 68 is formed of a conductive material capable of being easily connected to the electrode connection portion 56 of the electrode pad 24. For example, the electrode connection portion 68 may contain tin (Sn) or copper (Cu) as a main component.

FIGS. 2 to 11 are process views illustrating a method of manufacturing the semiconductor device 10, according to one embodiment. Description will be given of the method of manufacturing the semiconductor device 10 with reference to FIGS. 2 to 11. The manufacturing method according to this embodiment is a "via-last" type in which the through-electrode 32 is formed after the device section 14 is formed on and in the substrate 12.

Figure 2:
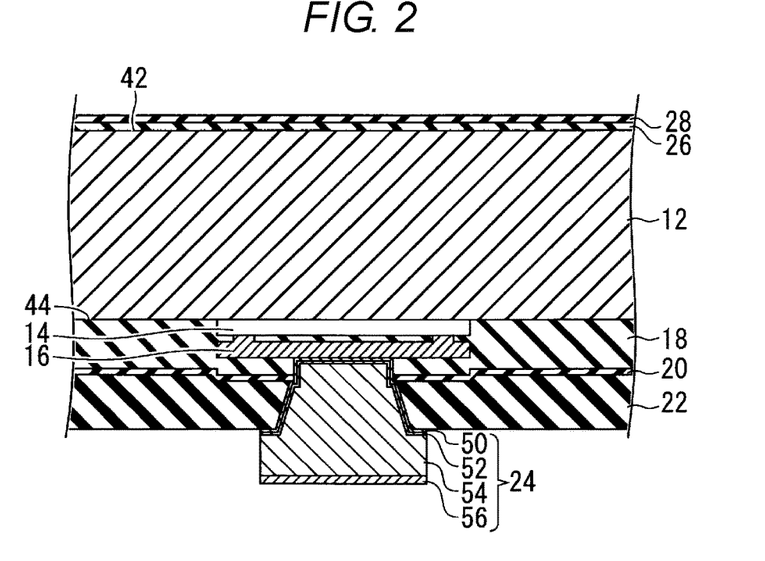
FIG. 2 is a longitudinal cross sectional view of the semiconductor device of FIG. 1 during the process of fabrication thereof.

As illustrated in FIG. 2, in the method of manufacturing the semiconductor device 10, the device section 14, the wiring layer 16, the interlayer insulating layer 18, the first passivation layer 20, the second passivation layer 22, and the electrode pad 24 are formed on the first surface 44 of the substrate 12. Next, the second surface 42 of the substrate 12 is polished by a mechanical polishing method and the like, thereby reducing the thickness of the substrate 12 to, for example, approximately 30 µm. After the polishing step, the first insulating layer 26 of a silicon oxide film is formed on the first surface 42 of the substrate 12 by a chemical vapor deposition (CVD) method. Next, the second insulating layer 28 of a silicon nitride film is formed on the first insulating layer 26 by the CVD method.

Figure 3:
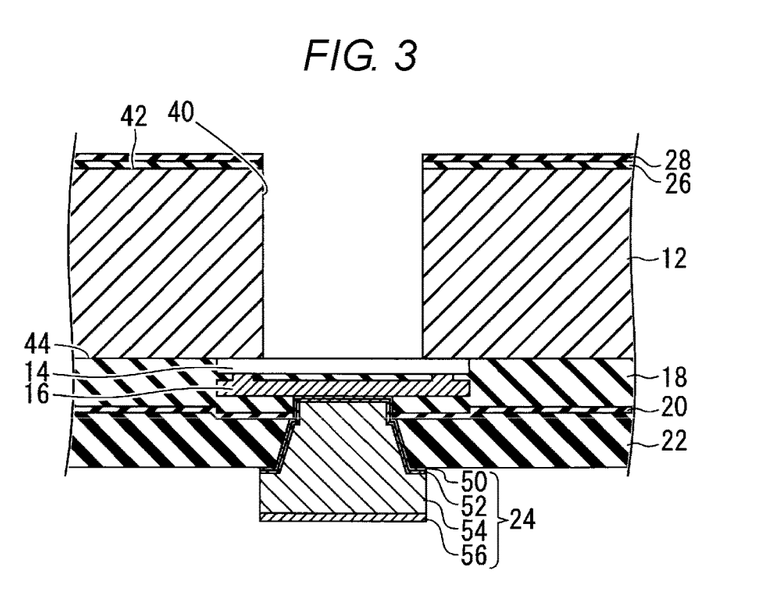
FIG. 3 is an additional longitudinal cross sectional view of the semiconductor device of FIG. 1 during the process of fabrication thereof showing changes during the processing thereof with respect to the cross sectional view of FIG. 2.

With the result as illustrated in FIG. 3, the first insulating layer 26, the second insulating layer 28, and the substrate 12 are etched by a reactive ion etching (RIE) method through a patterned mask. Accordingly, the through-hole 40, which passes through the substrate 12 from the second surface 42 to the first surface 44, is formed in the substrate 12.

Figure 4:
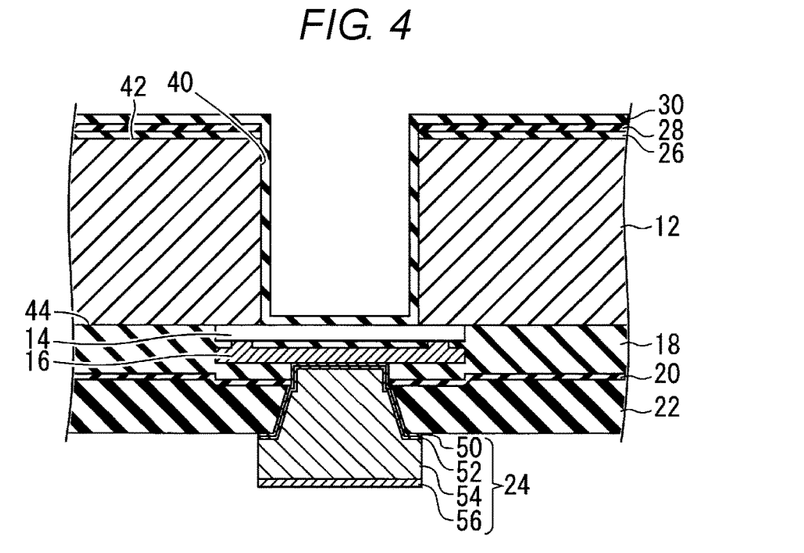
FIG. 4 is an additional longitudinal cross sectional view of the semiconductor device of FIG. 1 during the process of fabrication thereof showing changes during the processing thereof with respect to the cross sectional view of FIG. 3.

As illustrated in FIG. 4, the third insulating layer 30 using a silicon oxide film is formed on the second insulating layer 28 and in the through-hole 40, and over the region of the device section 14 which is exposed to the opening of the through-hole 40 on the first surface, using the CVD method.

Figure 5:
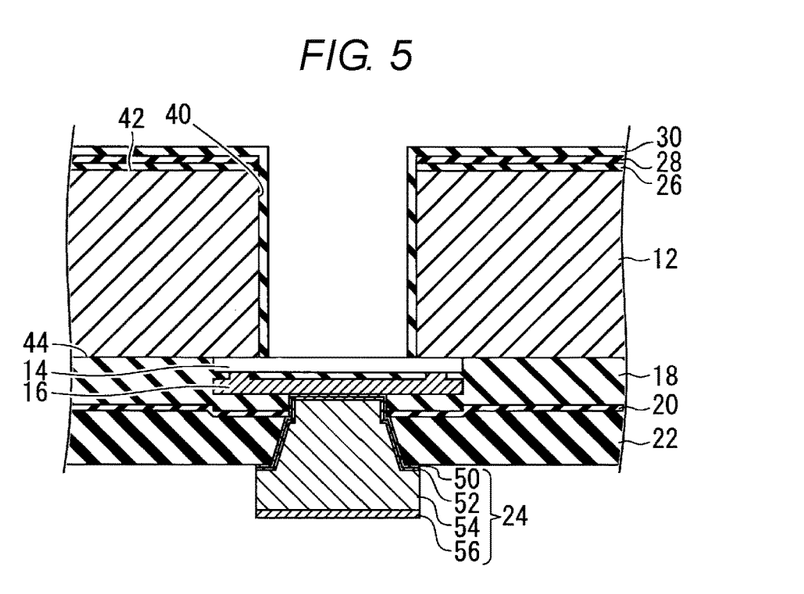
FIG. 5 is an additional longitudinal cross sectional view of the semiconductor device of FIG. 1 during the process of fabrication thereof showing changes during the processing thereof with respect to the cross sectional view of FIG. 4.

As illustrated in FIG. 5, the portion of the third insulating layer 30 formed on the device section 14 is removed by etching such as dry etching. Thus, the device section 14 is exposed to the through-hole 40.

Figure 6:
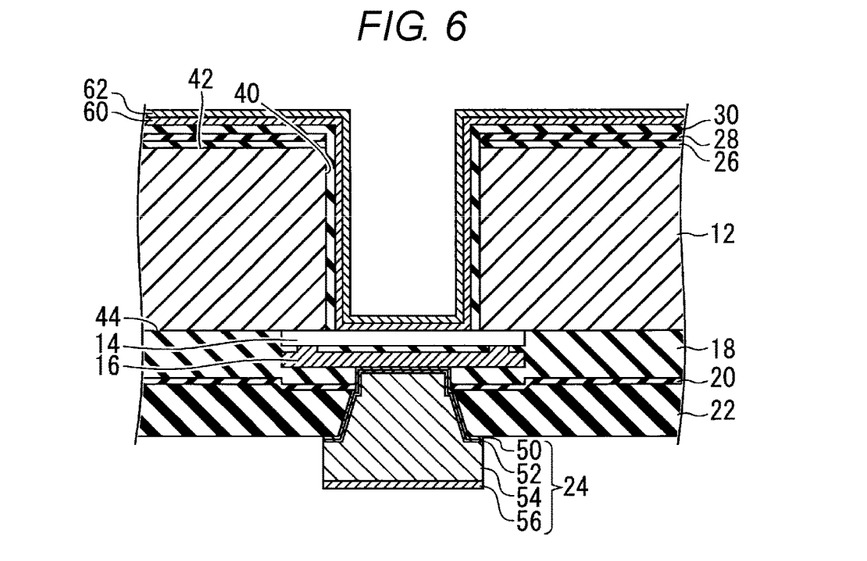
FIG. 6 is an additional longitudinal cross sectional view of the semiconductor device of FIG. 1 during the process of fabrication thereof showing changes during the processing thereof with respect to the cross sectional view of FIG. 5.

As illustrated in FIG. 6, the barrier metal layer 60 using titanium is formed on the third insulating layer 30 and a region of the device section 14, which is exposed to the opening of the through-hole 40 on the first surface side, by a chemical vapor deposition method or a sputtering method.

Next, a seed layer 62 using copper is formed on the barrier metal layer 60 by the chemical vapor deposition method or the sputtering method.

Figure 7:
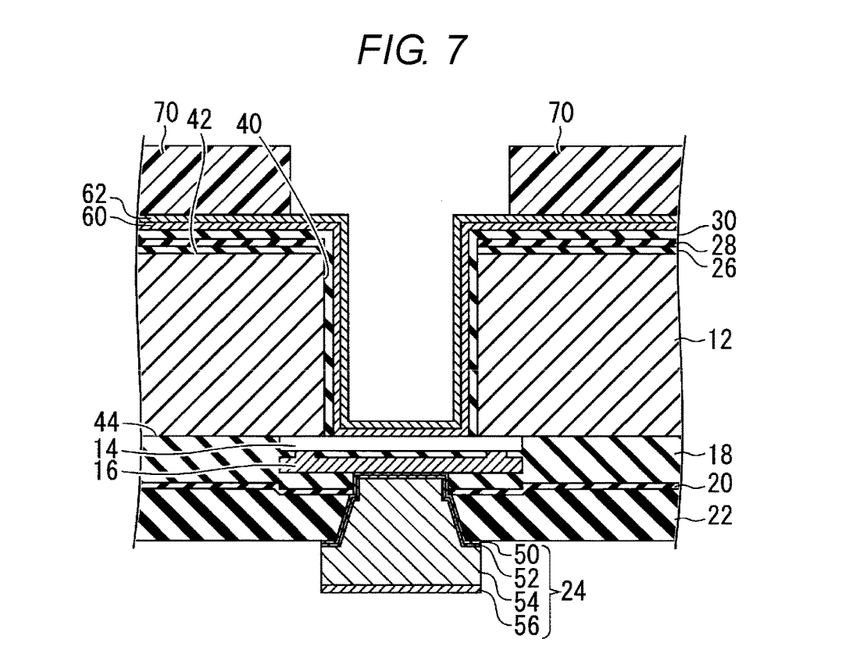
FIG. 7 is an additional longitudinal cross sectional view of the semiconductor device of FIG. 1 during the process of fabrication thereof showing changes during the processing thereof with respect to the cross sectional view of FIG. 6.

As illustrated in FIG. 7, a resist film 70 is formed on the seed layer 62 in a region other than an inner side of the through-hole 40 and in a region other than the periphery of the opening of the through-hole 40 on the second surface 42 side by photolithography. As a result, the through-hole 40, and the portion of the second surface 42 around the through-hole 40, is exposed through an opening in the resist film 70.

Figure 8:
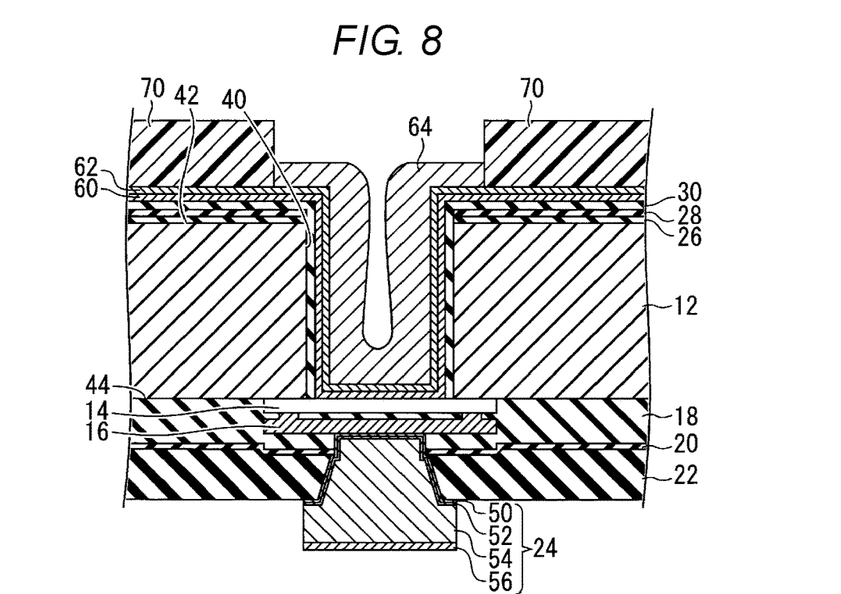
FIG. 8 is an additional longitudinal cross sectional view of the semiconductor device of FIG. 1 during the process of fabrication thereof showing changes during the processing thereof with respect to the cross sectional view of FIG. 7.

As illustrated in FIG. 8, the via-electrode 64 using nickel is formed on the seed layer 62 in the through-hole 40 through the opening in the resist film 70, by a conformal plating process. As the via-electrode 64 is being formed, the plated material layer that ultimately forms the via-electrode 64 grows from the seed layer, and thus in the through-hole 40, a width of a region, in which the via-electrode 64 is not formed and open to the second surface 44 side is smaller than the width of the deposited material at the first surface 42 side. In other words, an opening is formed in the via-electrode 64, which is formed in the through-hole 40, open to the second surface 42.

Figure 9:
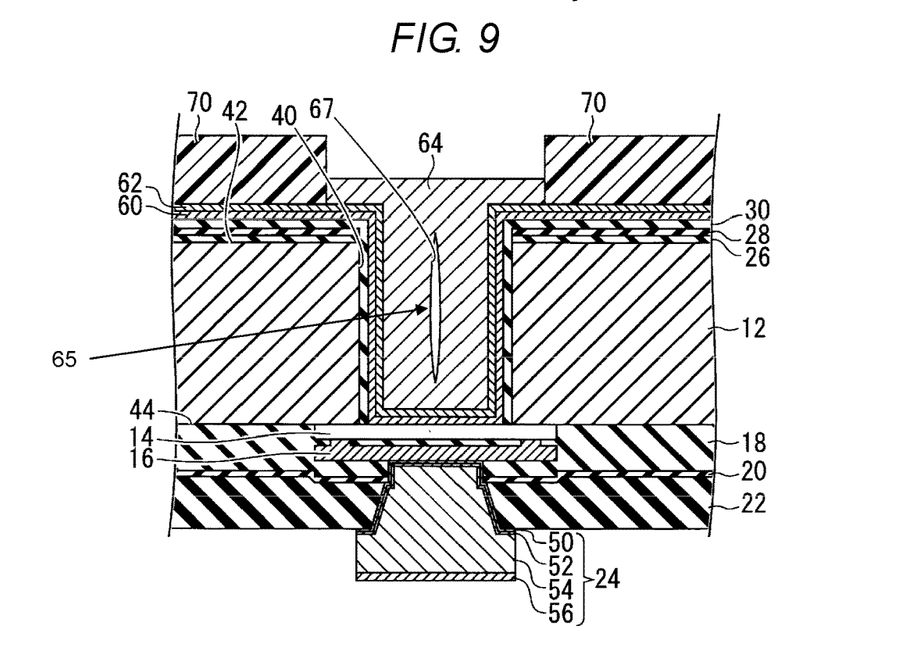
FIG. 9 is an additional longitudinal cross sectional view of the semiconductor device of FIG. 1 during the process of fabrication thereof showing changes during the processing thereof with respect to the cross sectional view of FIG. 8.

As illustrated in FIG. 9, as the conformal plating continues, the opening extending inwardly of the via-electrode 64 from the second surface 42 side becomes closed off, such that the cavity 67 is in the via-electrode 64. Accordingly, a via-electrode 64 in which the cavity 67 is present is formed in the through-hole 40. Further, although formation of the via-electrode 64 is not limited to the conformal plating, conformal plating is preferable when considering a shortened processing time and the choice of many different platable conductive materials.

Figure 10:
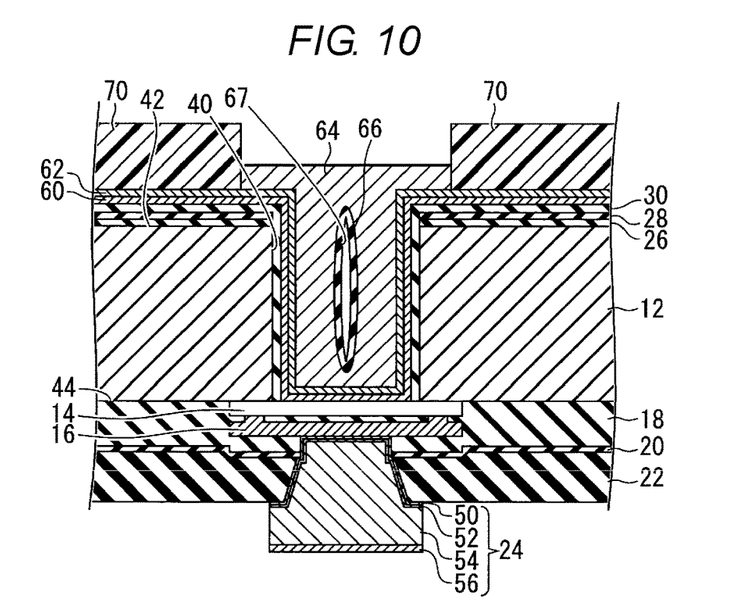
FIG. 10 is an additional longitudinal cross sectional view of the semiconductor device of FIG. 1 during the process of fabrication thereof showing changes during the processing thereof with respect to the cross sectional view of FIG. 10.

As illustrated in FIG. 10, at least the via-electrode 64 is heated to form a metal oxide film 66 containing a nickel oxide in situ between the via-electrode 64 and the cavity 67. For example, the via-electrode 64 is heated at a temperature in a range from 200° C. to 250° C. for several minutes to several hours. Accordingly, the metal such as nickel that configures the via-electrode 64 is oxidized by water (or dissolved oxygen) in the plating solution trapped in the cavity 67. Thus, a metal oxide film 66 is formed between the via-electrode 64 and the cavity 67.

Figure 11:
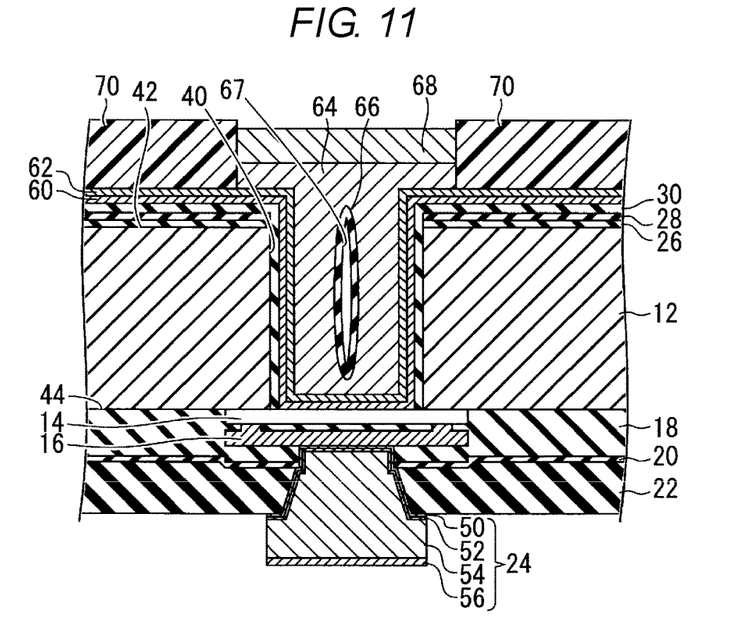
FIG. 11 is an additional longitudinal cross sectional view of the semiconductor device of FIG. 1 during the process of fabrication thereof showing changes during the processing thereof with respect to the cross sectional view of FIG. 10.

Next, as illustrated in FIG. 11, the electrode connection portion 68 using tin (Sn) is formed on the portion of the via-electrode 64 that is exposed in the opening in the resist film 70. Then, the resist film 70 is removed, and the electrode connection portion 68 is deformed in a curve shape using surface tension.

As described above, in the semiconductor device 10, the metal oxide film 66 is formed between the via-electrode 64 and a cavity 67 formed in the via-electrode 64. Accordingly, the metal oxide film 66 reinforces the via-electrode 64, and thus when heat or a mechanical stress is applied to the via-electrode 64 for a long period of time, and thus cracks would occur in the via-electrode 64, in the semiconductor device 10, it is possible to suppress propagation of a cracks from the cavity 67 in the via-electrode 64.

In the semiconductor device 10, since the metal oxide film 66 is configured with a metal oxide including a metal that configures the via-electrode 64, when the via-electrode 64 is heated, the metal oxide film 66 may be easily formed.

The above-described embodiment may be appropriately modified.

For example, in the above-described embodiment, as the method of manufacturing the semiconductor device 10, the via-last type is applied, but the semiconductor device may be manufactured by other manufacturing method such as a via-first type.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor device, comprising:
    a semiconductor substrate including a through-hole extending through the semiconductor substrate from a first surface to a second surface opposite the first surface;
    a metal member having a cavity therein defined by an internal surface of the metal member, the metal member being disposed in the through-hole;
    a metal oxide film coating the internal surface of the metal member; and
    a metal layer located in an opening of the through-hole formed in the second surface of the substrate, wherein the metal member protrudes from the opening of the through-hole beyond the metal layer.

2. The semiconductor device according to claim 1, wherein the metal oxide film comprises an oxide of a metal material that is included in the metal member.

3. The semiconductor device according to claim 1, wherein a connection portion containing tin or copper is located on a portion of the metal member that protrudes from the opening of the through-hole beyond the metal layer.

4. A semiconductor device, comprising;
    a semiconductor substrate having a first surface and a second surface opposed to the first surface;
    a device layer at the first surface of the substrate;
    a wiring layer overlying the device layer;
    a via hole extending through the substrate between the first and second surfaces thereof, the device layer being at least partially exposed to an interior of the via hole; and
    a metal plug in the via hole and extending therethrough, the metal plug comprising:
        a metal body material,
        a cavity in the metal body material, the cavity having an internal surface, and
        a metal oxide film on the internal surface of the cavity between the metal body material and the cavity, wherein
    the metal plug protrudes from the via hole beyond the second surface of the semiconductor substrate.

5. The semiconductor device of claim 4, wherein the cavity is completely surrounded by the metal body material.

6. The semiconductor device of claim 4, wherein the metal oxide film comprises an oxide of a metal in the metal body material.

7. The semiconductor device of claim 4, wherein the metal plug is electrically connected to the device layer.

8. The semiconductor device according to claim 4, further comprising:
    an electrode extending outwardly of the first surface.

9. The semiconductor device according to claim 8, wherein
    the wiring layer is between the device layer and the electrode, and
    the electrode is electrically connected to the wiring layer.

10. The semiconductor device according to claim 9, wherein the metal plug directly contacts a conductive portion of the device layer.

* * * * *